(12) United States Patent
Butler

(10) Patent No.: US 6,392,304 B1
(45) Date of Patent: May 21, 2002

(54) MULTI-CHIP MEMORY APPARATUS AND ASSOCIATED METHOD

(75) Inventor: Douglas B. Butler, Colorado Springs, CO (US)

(73) Assignees: United Memories, Inc., Colorado Springs, CO (US); Nippon Steel Semiconductor Corporation, Chiba (JP)

( * ) Notice: Subject to any disclaimer, the term of this patent is extended or adjusted under 35 U.S.C. 154(b) by 0 days.

(21) Appl. No.: 09/190,660

(22) Filed: Nov. 12, 1998

(51) Int. Cl.[7] .............................................. H01L 29/40
(52) U.S. Cl. ...................................... 257/777; 257/686
(58) Field of Search ................................ 257/723, 777, 257/778, 686, 685

(56) References Cited

U.S. PATENT DOCUMENTS

| | | | |
|---|---|---|---|
| 4,983,533 A | 1/1991 | Go ................................... | 437/7 |
| 5,347,428 A | 9/1994 | Carson et al. ............... | 361/760 |
| 5,468,681 A | 11/1995 | Pasch .......................... | 437/183 |
| 5,537,738 A | 7/1996 | Cathey et al. ................ | 29/830 |
| 5,561,622 A | 10/1996 | Bertin et al. .................... | 365/51 |
| 5,563,086 A | 10/1996 | Bertin et al. ................... | 437/52 |
| 5,702,984 A | 12/1997 | Bertin et al. ................ | 437/208 |
| 5,790,384 A | * 8/1998 | Ahmad et al. .............. | 257/777 |
| 6,084,308 A | * 7/2000 | Kelkar et al. ................ | 257/777 |

OTHER PUBLICATIONS

Al–Sarawi, Said F., *Flip–chip Bonded Stacked Chips without Spacers*, Centre for High Performance Integrated Technologies and Systems (CHIPTEC), Adelaide, SA 5005, Internet site: http://www.eleceng.adelaide.edu.au/Person . . . ing/node37.html, Mar. 1997.

Al–Sarawi, Said F., *Solder Bump Bonding*, Centre for High Performance Integrated Technologies and Systems (CHIPTEC), Adelaide, SA 5005, Internet site: http://www.eleceng.adelaide.edu.au/Person . . . ing/node37.html, Mar. 1997.

* cited by examiner

*Primary Examiner*—Roy Potter
(74) *Attorney, Agent, or Firm*—Stuart T. Langley; William J. Kubida; Hogan & Hartson LLP

(57) ABSTRACT

A multi-chip integrated circuit, and an associated method, provides an interface of substantially reduced levels of capacitance and inductance relative to conventional connections formed of bond wires. One of the chips of the integrated circuits comprises a memory device, such as a DRAM, and another of the chips of the integrated circuit is formed of a logic chip, such as a CPU or graphics controller. The memory chip is mounted upon the logic chip utilizing chip-on-chip technology. Because of the reduced levels of capacitance and inductance of the interface connecting the chips together, the resultant integrated circuit can be operated at increased speeds and at reduced levels of power consumption.

11 Claims, 6 Drawing Sheets

MULTI-CHIP MEMORY APPARATUS AND ASSOCIATED METHOD

The present invention relates, in general, to an integrated-circuit, memory device, such as a DRAM (dynamic random access memory). More particularly, the present invention relates to an integrated circuit in which a DRAM, or other memory device, is mounted directly onto a logic chip. In one implementation, the mounting is formed using chip-on-chip technology, thereby obviating the need for bond wiring, conventionally used to connect separate memory and logic chips.

Through the use of flip-chip technology which utilizes bond pads by which to form connections in a multi-chip, integrated-circuit package, interconnections formed between the memory device and the logic chip are of substantially reduced levels of capacitance. Such reduced levels of capacitance, reduce amounts of power required to operate a circuit formed of the memory and logic chips. Also, such reduced levels of capacitance permits the circuit to be operated at increased speeds.

BACKGROUND OF THE INVENTION

Integrated circuit memory devices are used in many electronic systems. Such memory devices provide storage of data necessary to the function of the electronic system. One or more non-memory integrated circuits of the electronic system access the data stored in the memory devices.

Different types of integrated circuit memory devices are used to meet the different requirements of electronic systems. ROM (Read Only Memory), EPROM (Electrically Programmable Read Only Memory), EEPROM (Electrically Erasable Programmable Read Only Memory), SRAM (Static Random Access Memory) and DRAM are among the integrated circuit memory types commonly used in electronic systems.

DRAM (Dynamic Random Access Memory) is generally used in applications which require low cost, large amounts of data storage and fast read and write access to the data. SRAM is generally faster but more expensive than DRAM. EEPROM is nearly the same cost as DRAM but the write access is not random and is too slow for many applications. EPROM can be erased only by exposure to ultraviolet light and otherwise can be written only once and cannot be used for most applications. ROM is hard wired with data and can only be read and cannot be used if writing data to the memory is required. The general utility of DRAM has resulted in DRAM being the most common type of integrated circuit memory.

As the non-memory integrated circuits increase in speed it is desirable to have the memory integrated circuits increase in speed. DRAM speed has been increased by improvements in the definition of how the DRAM interfaces to non-memory integrated circuits. These interface definitions include FPM (Fast Page Mode), EDO (Extended Data Out), SDRAM (Synchronous DRAM) and DDRSDRAM (Double Data Rate DRAM). Each of these interface definitions has allowed the DRAM to output data at progressively faster rates.

In addition, DRAM speeds have been increased by increasing the number of bits the DRAM outputs at a time or the width of the output. The amount of data a memory can output is determined by the output width multiplied by the output data rate.

The inductance and capacitance associated with connecting an integrated circuit in one package to an integrated circuit in another package create problems if the data transfer rate is high. In order to solve these problems many interface standards have been developed including TTL, LVTTL and SSTL. These interface standards use a reference voltage connected via a load resistor to each output node. The voltage swing of the output is restricted but extra power is consumed since any current through the load resistor is wasted. As the data output rate increases, the drive of the output circuits must be increased so that the capacitance on the outputs can be charged or discharged more quickly. This causes the voltage swing on the output to increase which causes more power to be consumed through the load resistor.

Reducing both the inductance and capacitance on data outputs would allow higher data transfer rates. One packaging technology which reduces the inductance and capacitance on data outputs is referred to as Flip Chip mounting wherein an integrated circuit is mounted (face down) directly to a printed circuit board. This eliminates inductance and capacitance associated with bond wires and package lead frame but the capacitance and inductance associated with the printed circuit board remains.

Integrated circuit technology advances are enabling more components of an electronic system to be contained on one integrated circuit. Integration of more components of an electronic system into one integrated circuit generally reduces cost of the system. The cost reduction results from reduced power, reduced size and reduced assembly complexity. This cost reduction makes integrating memory and non-memory chips into the same integrated circuit desirable.

Integrating memory and non-memory circuits into the same integrated circuit chip incurs a cost penalty. The cost penalty is due to memory and non-memory circuits having different process requirements. The differing processing requirements can be explained, e.g. with respect to an example in which a pmemory is formed of a DRAM and a non-memory circuit is formed of a logic circuit.

A DRAM consists of an array of memory elements. Each element consists of a capacitor and a transistor. During the DRAM operation, a voltage level (a high voltage for a data 1, a low voltage for a data 0) is placed on the capacitor and the gate of the transistor is forced to a voltage which turns the transistor off. The data can then be read at a later time by turning the transistor on and sensing the voltage stored on the capacitor. Sensing the voltage requires the capacitance value of the capacitor to be adequate. The voltage on the capacitor will change due to leakage so the data must be read and rewritten frequently to prevent data loss. For a given leakage value the rate of change of the voltage stored on the capacitor is inversely proportional to the capacitance of the capacitor. Therefore the capacitance of the capacitor must be large enough to allow adequate refresh time (i.e., time between refreshes). Also, the leakage from the capacitor must be minimized to provide adequate refresh time. The DRAM capacitor and the very low leakage requirement are unique to the DRAM and are not required by the logic circuit.

A logic circuit requires more levels of interconnect than a DRAM. Advanced DRAMs use two levels of metal interconnect while advanced logic circuits use four or five levels of interconnect. A logic circuit requires the highest performance transistors possible to insure adequate performance of the logic circuit but there is not a requirement for the low leakage levels of a DRAM. Therefore, the logic transistor is designed differently with respect to gate oxide thickness, source and drain doping profiles and isolation than the DRAM transistor.

The differences listed above and others have resulted in DRAM and logic processes being quite different. When DRAM and logic is combined onto a single integrated circuit the process required is significantly more complicated than either the DRAM process or the logic process.

It is in light of this background information that the significant improvements of the present invention have evolved.

SUMMARY OF THE INVENTION

The present invention, accordingly, advantageously provides a multi-chip device, and an associated method, in which a memory integrated circuit, such as a DRAM, is mounted directly onto a non-memory integrated circuit, such as a logic chip.

In such a manner, the need for the bond wires, lead frames and printed circuit board traces conventionally used to connect separate memory and non-memory chips, is obviated. Formation of a multi-chip package through the use of chip-on-chip technology permits interconnects between the memory and non-memory chip to be formed which exhibit substantially reduced levels of capacitance and inductance. The levels of capacitance and inductance are reduced to levels such that the interfaces formed by the connections between the memory and non-memory chips appear to the respective chips to be internal nodes of such chips.

Reduction in the levels of capacitance of the interconnections between the non-memory chip and memory chip reduces the power required to transfer data at a given rate between the non-memory chip and the memory chip.

Reduction in the levels of capacitance and -U inductance of the interconnections between the non-memory chip and memory chip increases the rate at which data transfer between non-memory chip and memory chip can occur without problems associated with ringing which require specialized interfaces such as TTL, LVTTL or SSTL.

In one implementation, the memory integrated circuit is a DRAM memory chip. The DRAM memory chip is mounted, using technology similar to flip chip technology, upon a logic chip such that bond pads of the DRAM memory chip are connected to the bond pads of the logic chip with solder or gold bumps or balls.

Said gold or solder bumps or balls provide all electrical interconnection between the memory and logic chips including power, control and data exchange. Circuits used to drive interconnections between memory and logic chips are distinguished by being designed to drive only loads associated with the small capacitance associated with this chip-on-chip assembly. Further, interconnections between memory and logic chips are driven to full power and ground levels, obviating the need for specialized interfaces such as TTL, LVTTL or SSTL.

In these and other aspects, therefore, a multi-chip integrated circuit package, and an associated method, is provided. The package includes a memory integrated circuit having a selected number of storage locations for storing data therein and having memory chip bond pads. A non-memory integrated circuit has bond pads for abutting together with the memory chip bond pads. An interconnector provides an electrical connection between the memory and non-memory chip bond pads.

A more complete appreciation of the present invention and the scope thereof can be obtained from the accompanying drawings which are briefly summarized below, the following detailed description of the presently-preferred embodiments of the invention, and the appended claims.

The mounting pads 14 permit electrical connection to an integrated circuit chip-on-chip mounted thereon. And, the mounting pads 16 provide for electrical connection with electrical interconnects (not shown) to other structure (also not shown).

Figure 1A:
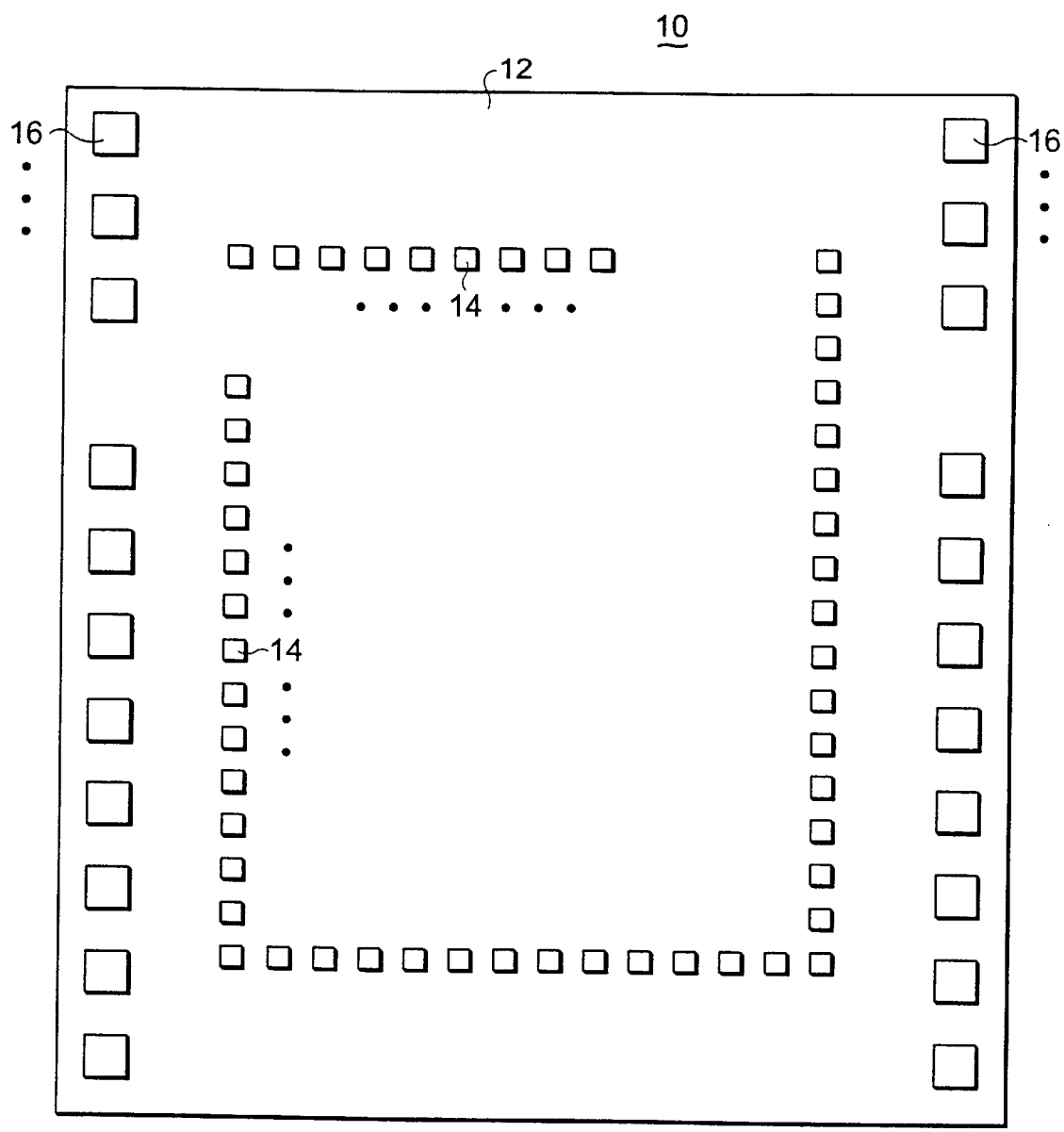
FIG. 1A illustrates a plan view, taken from above a non-memory integrated circuit which forms a portion of an embodiment of the present invention.
Figure 1B:
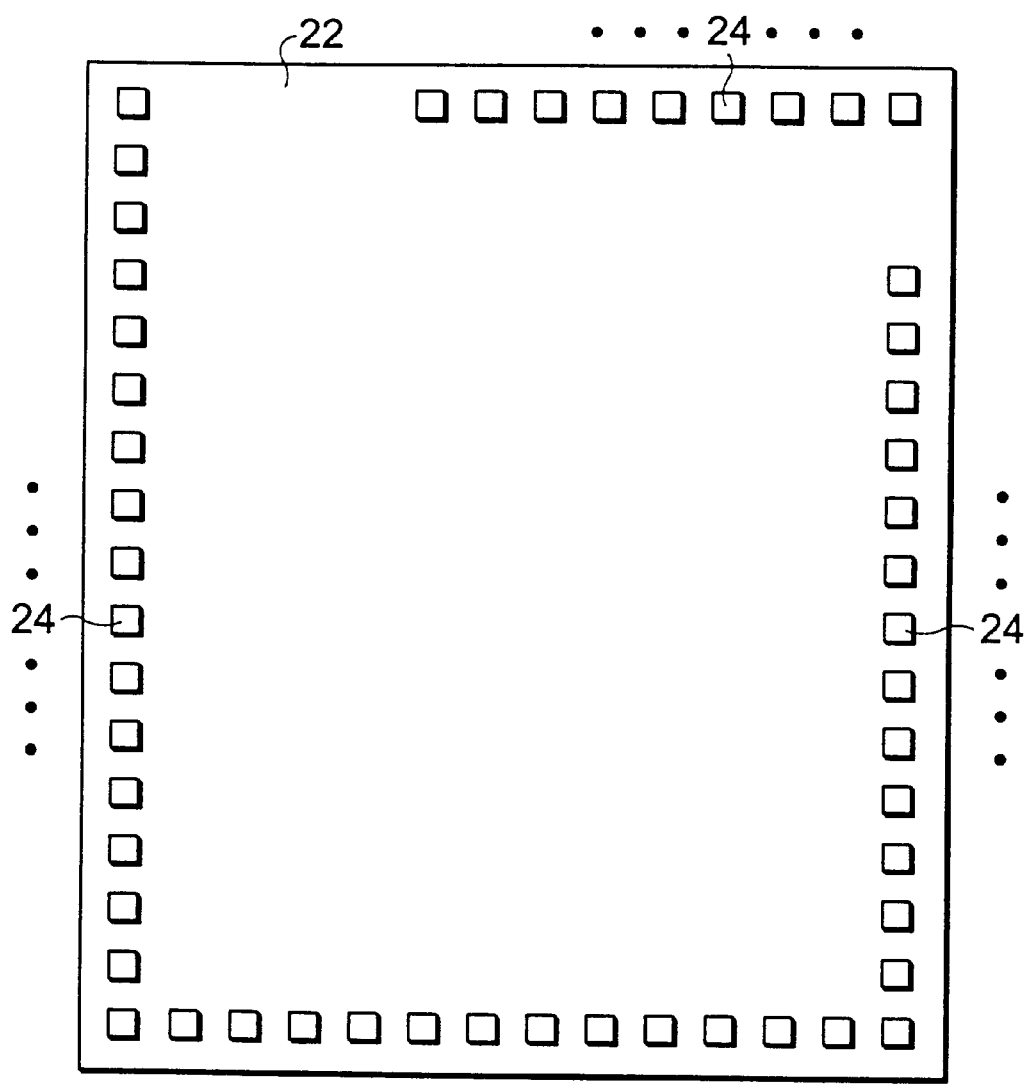
FIG. 1B illustrates a plan view, taken from beneath a memory integrated circuit which forms a portion of an embodiment of the present invention.

FIG. 1B illustrates a memory integrated circuit, shown generally at 18, which, in an exemplary embodiment, is formed of a DRAM (dynamic random access memory), of a memory capacity great enough to permit appropriate amounts of data to be stored thereat. The memory device 18 includes a bottom-face surface 22 having a plurality of mounting pads 24 formed thereon. The mounting pads 24 correspond in number and position with the mounting pads 14 formed upon the top-face surface 12 of the integrated circuit 10. Thereby, when the bottom-face surface 12 of the integrated circuit 18 is aligned with the top-face surface 12 of the integrated circuit 10, such that the integrated circuit 18 is positioned directly above the integrated circuit 10, the mounting pads 14 and 24 of the respective integrated circuits become positioned in an aligned relation therewith.

When the integrated circuit 10 includes logic circuitry embodied therein for performing logic functions, the memory capacity of the memory integrated circuit 18 is advantageously selected such that the memory requirements necessary for optimal operation of the logic circuitry forming the integrated circuit 10 is satisfied by the memory capacity of the memory integrated circuit 18. While the integrated circuits 10 and 18 of the exemplary illustrations shown in FIGS. 1A and 1B show an arrangement in which a single integrated circuit 18 is to be flip-chip mounted upon the top-face surface 12 of the integrated circuit 10, in other implementations, one memory integrated circuit 18 can be flip-chip mounted upon the top-face surface 12, thereby to provide the logic circuitry embodied in the integrated circuit 10 with appropriate amounts of storage capacity.

Figure 2:
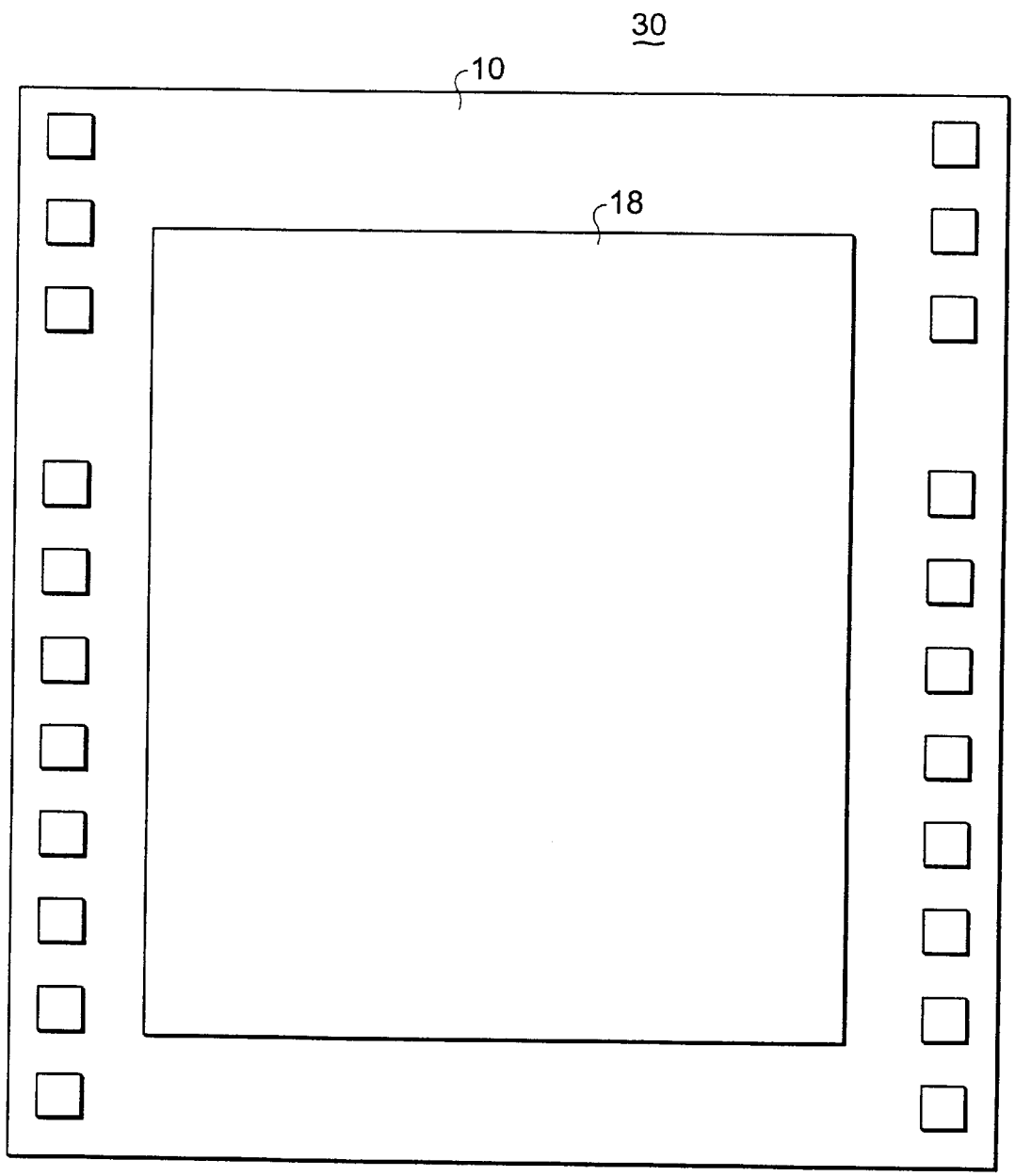
FIG. 2 illustrates a plan view of the memory integrated circuit shown in FIG. 1B flip-chip mounted up on the non-memory integrated circuit shown in FIG. 1A, together to form a multi-chip integrated circuit of an embodiment of the present invention.

FIG. 2 illustrates the multi-chip integrated circuit, shown generally at 30, formed of the integrated circuit 10 upon which the memory integrated circuit 18 is flip-chip mounted thereon. The mounting pads 14 and 24 formed upon the top and bottom-face surfaces 12 and 22, respectively, of the respective integrated circuits are hidden from view in the Figure, but are aligned with one another to permit connections to be formed therebetween.

Figure 3:
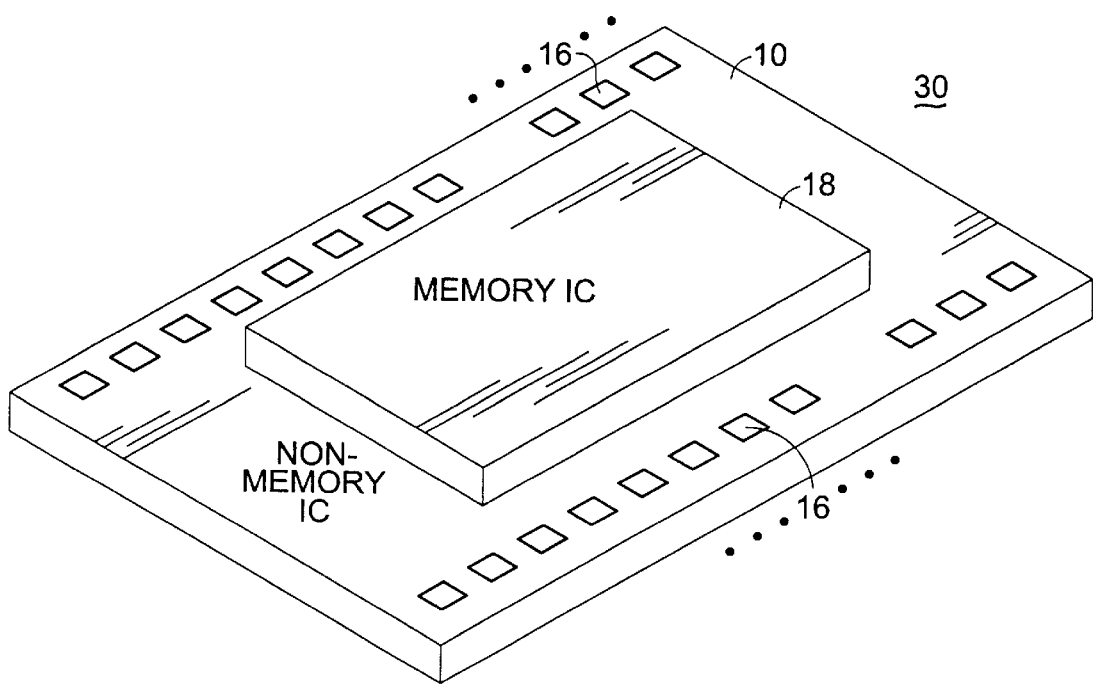
FIG. 3 illustrates a perspective view of the multi-chip integrated circuit shown in FIG. 2.

FIG. 3 also illustrates the multi-chip integrated circuit 30 formed of the non-memory integrated circuit 10 upon which the memory integrated circuit 18 is chip-on-chip mounted thereon. The mounting pads 14 and 24 of the integrated circuits 10 is and 18, respectively, are again hidden from view in the Figure. The mounting pads 16 formed upon the topface surface 12 of the integrated circuit 10 are again illustrated in the Figure.

Figure 4:
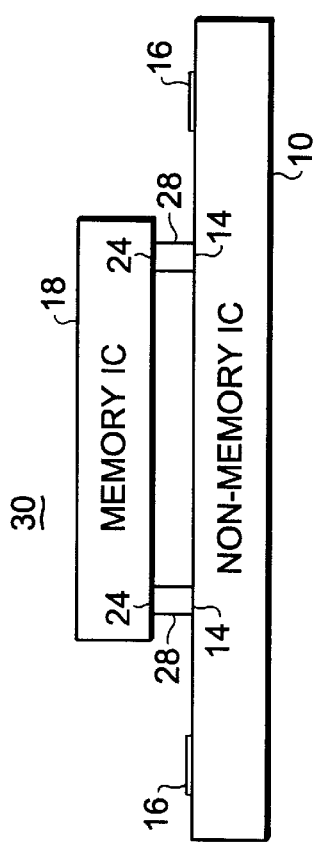
FIG. 4 illustrates a side-elevational view of the multi-chip integrated circuit shown in FIG. 2–3.

The side-elevational view of FIG. 4 illustrates the memory integrated circuit 18 flip-chip mounted upon the non-memory integrated circuit 10. Solder balls 28 further form portions of the multi-chip integrated circuit 30. The solder balls 28 correspond in number and positioning with the number and positioning of the mounting pads 14 and 24 of the integrated circuits 10 and 18. In the exemplary embodiment, the solder balls are both electrically and mechanically affixed to the mounting pads 14.

The memory integrated circuit 18 is connected to the integrated circuit 10 by aligning the solder balls 28 with the mounting pads 24 of the memory integrated circuit 18 and positioning the solder balls 28 and mounting pads 24 in a butting engagement theretogether. Solder connections, for example, are formed by increasing the ambient temperature levels to cause solder flow formed in conventional manner.

The electrical interconnections between the memory integrated circuit 18 and the non-memory integrated circuit 10 provide all necessary connections such as common input/output pads, control pads upon which RAS (row address select), WE (write enable), OE (output enable) and CAS (column address select), commands are generated, and power pads by which voltage and ground connections to the memory integrated circuit 18 are provided.

Once the connections have been formed, powering of the memory integrated circuit is enabled, and control signals can be generated to perform read and write operations upon the data stored in the storage locations of the memory integrated circuit 18. The connections so-formed are advantageously of low levels of capacitance. For instance, the levels of capacitance exhibited by input/output connections are reduced to about 0.5 pF in contrast to 30–100 pF of capacitance exhibited by conventional connections between separate chips. And, levels of the inductance of chip-to-chip interconnections are reduced substantially to zero in contrast to typical values of about 50 nH of inductance exhibited by connections formed in conventional fashion.

The levels of capacitance and inductance of the interface formed of the mounting pad/solder ball combination is lowered to an extent such that the interface appears to the memory integrated circuit 18 as an internal node of the memory device. Analogously, the interface also appears to the circuitry of the non-memory integrated circuit 10 to be merely an internal node thereof.

The current, and therefore also power, in a circuit is directly proportional to the capacitance in the circuit. More particularly, the current in a circuit, and also the power, is equal to the capacitance in the circuit multiplied by the time rate of change of the voltage. Therefore, by reducing the level of capacitance, the time rate at which the voltage can be changed in a circuit can correspondingly be reduced. Thus, the interface formed of the mounting pad/solder ball combination provided through operation of an embodiment of the present invention permits an increase in speed at which the circuit can be operated as well as a decrease in the levels of power required to operate the circuit.

Analogously, because of the reduced levels of capacitance, for a given level of power the bandwidth of data transferred between the memory integrated circuit 18 and the integrated circuit 10 can be increased. Namely, the total output current of the memory integrated circuit 18 is governed by the following equation:

$$I_t = (\text{Number of I/Os}) * C * V_{cc} * \text{freq}/2$$

Wherein: $I_t$ is the total output current;

C is the capacitance of the circuit; and freq is the frequency at which the circuit is operated.

Examination of the equation indicates that, by reducing the level of capacitance, the number of I/O pads can be increased without increasing the total output current, and the associated power governed thereby. Thereby, through operation of an embodiment of the present invention, the bandwidth of data transfer can be increased without increasing the required power level at which the memory device is operated.

Additionally, when the interface is of such reduced levels of capacitance, the specifications to which the memory integrated circuit 18 must be constructed can be altered. That is to say, when conventional connectors, such as bond wires, are used to connect the memory integrated circuit 18 with the non-memory circuitry embodied in a separate chip, the memory integrated circuit must be constructed to be able to drive a circuit including the capacitance exhibited by such conventional connections. When, however, the interface of an embodiment of the present invention is utilized to form the connection between the memory integrated circuit 18 and the integrated circuit 10, the memory integrated circuit 18 need only be constructed to drive a load which exhibits the lowered level of capacitance.

Figure 5:
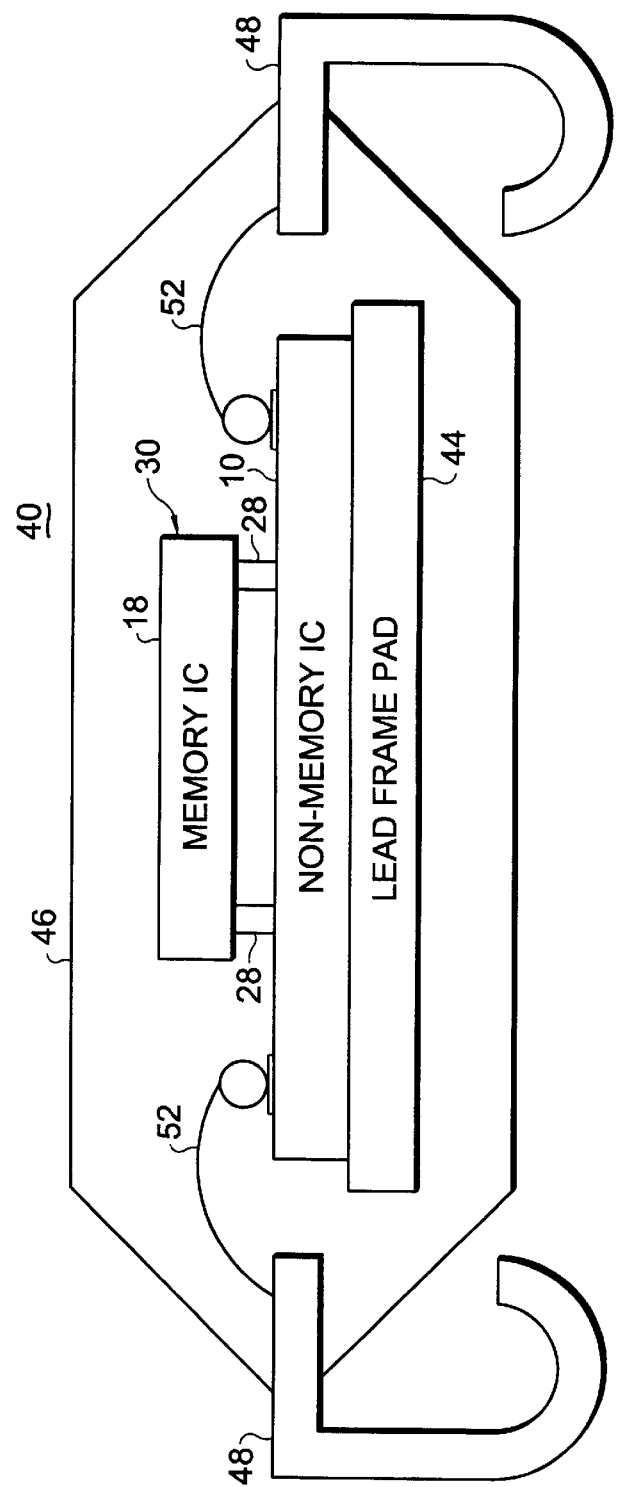
FIG. 5 illustrates a partial-cutaway, partial-functional block, side-elevational view of an integrated circuit package which includes the multi-chip integrated circuit shown in FIGS. 2–4.

FIG. 5 illustrates a packaged integrated circuit, shown generally at 40, of an embodiment of the present invention. The packaged integrated circuit includes the chip-on-chip integrated circuit 30 shown in FIGS. 2–4. Here, the integrated circuit 40 is shown also to include the non-memory integrated circuit 10, here a logic chip upon which the memory integrated circuit 18 is chip-on-chip mounted by way of solder balls 28. The interface formed of the solder ball 28/mounting pad 14 and 24 combination is again formed as above-described. Namely, the interfaces formed of a plurality of solder balls 28 mechanically and electrically affixed to the non-memory integrated circuit 10 and solder-connected to the memory integrated circuit 18.

The packaged integrated circuit 40 further includes a lead-frame pad 44 upon which the non-memory integrated circuit 10 is positioned. The pad 44 is supported in an integrated circuit package 46, in conventional fashion. Leads 48 extend beyond the IC package 46 to permit connection to external circuitry (not shown), also in conventional fashion. Bond wires 52 are also shown in the Figure. The bond wires 52 interconnect the mounting pads 16 with the leads 48.

Because of the low levels of capacitance and inductance exhibited by the interface formed between the integrated circuits 10 and 18, the elements thereof appear to the respective integrated circuits essentially merely to be internal nodes of the respective circuits. Such lowered levels of capacitance and inductance further, for reasons above-described, permits increased speeds at which write and read operations to and from the storage locations of the memory device can be effectuated at reduced levels of power consumption. And, also because of the reduced levels of capacitance exhibited by the interface so-formed, the memory integrated circuit can be constructed to conform to specifications which require the memory integrated circuit to be able to drive loads of such lessened levels of capacitance.

Figure 6:
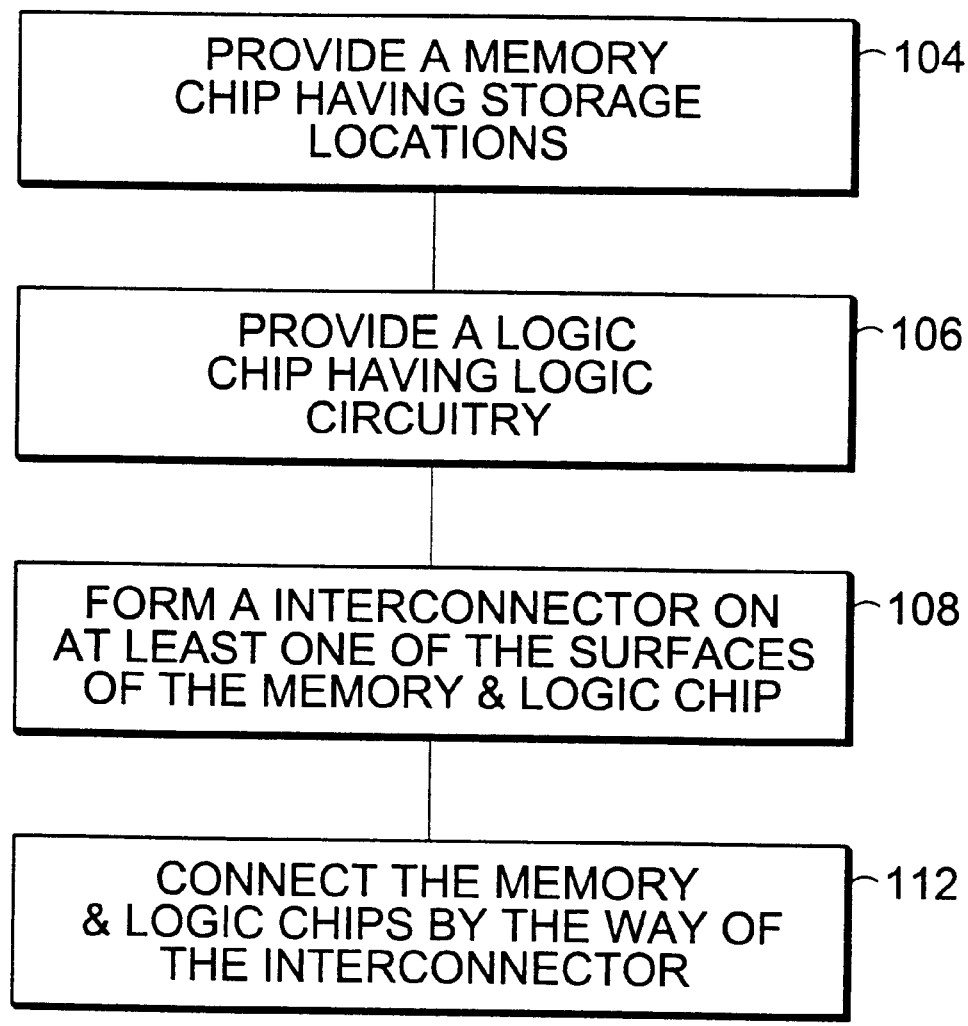
FIG. 6 illustrates a method flow diagram listing the method steps of the method of an embodiment of the present invention. DETAILED DESCRIPTION Referring first to FIG. 1A, a non-memory integrated circuit shown generally at 10, includes a top-face surface 12 upon which a first plurality 14 and a second plurality 16 of mounting pads, respectively, are formed. The non-memory integrated circuit includes circuit component portions which together form a circuit device, such as a logic device which performs logic functions. In one exemplary implementation, for instance, the integrated circuit 10 includes the logic circuitry of a CPU (central processing unit). In another implementation, the integrated circuit 10 forms a graphics controller. And, in other implementations, other circuitry is embodied in the integrated circuit 10.

FIG. 6 illustrates a method flow diagram, shown generally as 102 of an embodiment of the present invention. The method 102 is a method for fabricating an integrated circuit. First, and as indicated by the block 104, a memory chip is provided. The memory chip includes a selected number of storage locations for storing data therein. And, the memory chip includes a memory-chip face surface. Next, and as indicated by the block 106, a logic chip is provided. The logic chip includes logic circuitry for performing a logic function. The logic chip includes a logic-chip face surface.

Then, and as indicated by the block 108, an interconnector is formed upon at least one of the memory-chip face surface and the logic-chip face surface. Then, and as indicated by the block 112, the memory chip and the logic chip are connected by positioning the memory chip and the logic chip in abutting engagement by way of the interconnector.

Operation of an embodiment of the present invention provides a multi-chip, integrated-circuit package in which interconnections formed between the memory device and the logic chip are of substantially reduced levels of capacitance and inductance. Such reduced levels of capacitance reduces amounts of power required to operate a circuit formed of the memory and logic chips. Such reduced levels of capacitance and inductance also permits the circuit to be operated at increased speeds.

The previous descriptions are of preferred examples for implementing the invention, and the scope of the invention should not necessarily be limited by this description. The scope of the present invention is defined by the following claims.

What is claimed is:

1. A multi-chip integrated circuit package comprising:
   a memory integrated circuit, said memory integrated circuit having a selected number of storage locations for storing data therein, said memory integrated circuit including memory chip bond pads;
   a non-memory integrated circuit, said non-memory integrated circuit having non-memory chip bond pads a subset thereof positioned to abut together with the memory chip bond pads; and
   gold balls formed between each corresponding memory chip bond pad and non-memory chip bond pad, said gold balls providing electrical connection between said memory chip bond pads and said non-memory chip bond pads.

2. A multi-chip integrated circuit package comprising:
   a memory integrated circuit, said memory integrated circuit having a selected number of storage locations for storing data therein, said memory integrated circuit including memory chip bond pads;
   a non-memory integrated circuit, said non-memory integrated circuit having circuit-connection nodes, and non-memory chip bond pads, a subset thereof positioned to abut together with the memory chip bond pads;
   an interconnector formed between each corresponding memory chip bond pad and non-memory chip bond pad, said interconnector providing electrical connection between said memory chip bond pads and said non-memory chip bond pads; and
   an enclosure for enclosing both said memory integrated circuit and said non-memory integrated circuit, external nodes positioned external to said enclosure, and an electrical connection connecting said circuit-connection nodes and external nodes together.

3. The multi-chip integrated circuit package of claim 2 wherein the said enclosure is plastic.

4. The multi-chip integrated circuit package of claim 2 wherein the said enclosure is ceramic.

5. A multi-chip integrated circuit package comprising:
   a memory integrated circuit optimized to provide optimum drive to a low capacitance interface, said memory integrated circuit having a selected number of storage locations for storing data therein, said memory integrated circuit including memory chip bond pads;
   a non-memory integrated circuit, said non-memory integrated circuit having non-memory chip bond pads a subset thereof positioned to abut together with the memory chip bond pads; and
   an interconnector formed between each corresponding memory chip bond pad and non-memory chip bond pad, said interconnector providing electrical connection between said memory chip bond pads and said non-memory chip bond pads.

6. A multi-chip integrated circuit package comprising:
   a memory integrated circuit, said memory integrated circuit having a selected number of storage locations for storing data therein, said memory integrated circuit including memory chip bond pads;
   a non-memory integrated circuit optimized to provide optimum drive to a low capacitance interface, said non-memory integrated circuit having non-memory chip bond pads, a subset thereof positioned to abut together with the memory chip bond pads; and
   an interconnector formed between each corresponding memory chip bond pad and non-memory chip bond pad, said interconnector providing electrical connection between said memory chip bond pads and said non-memory chip bond pads.

7. A multi-chip integrated circuit package comprising:
   a DRAM (dynamic read/write memory), said DRAM having a selected number of storage locations for storing data therein, said DRAM including memory chip bond pads;
   a non-memory integrated circuit, said non-memory integrated circuit having non-memory chip bond pads, a subset thereof positioned to abut together with the memory chip bond pads; and
   an interconnector formed between each corresponding memory chip bond pad and non-memory chip bond pad, said interconnector providing electrical connection between said memory chip bond pads and said non-memory chip bond pads.

8. A multi-chip integrated circuit package comprising:
   a memory integrated circuit, said memory integrated circuit having a selected number of storage locations for storing data therein, said memory integrated circuit including memory chip bond pads;
   a non-memory integrated circuit, said non-memory integrated circuit having non-memory chip bond pads, a subset thereof positioned to abut together with the memory chip bond pads; and solder balls electrically connected, and mechanically affixed, to said memory integrated circuit formed between each corresponding memory integrated circuit bond pad and non-memory integrated circuit bond pad, said solder balls providing electrical connection between said memory chip bond pads and said non-memory chip bond pads.

9. A multi-chip integrated circuit package comprising:

a memory integrated circuit, said memory integrated circuit having a selected number of storage locations for storing data therein, said memory integrated circuit including memory chip bond pads;

a non-memory integrated circuit, said non-memory integrated circuit having non-memory chip bond pads, a subset thereof positioned to abut together with the memory chip bond pads; and solder balls electrically connected, and mechanically affixed, to said non-memory integrated circuit formed between each corresponding memory chip bond pad and non-memory chip bond pad, said solder balls providing electrical connection between said memory chip bond pad and said non-memory chip bond pad.

10. An integrated circuit comprising:

a DRAM (dynamic random access memory), said DRAM having a selected number of storage locations for storing data therein, said memory chip including a memory-chip face surface;

a logic chip having a logic-chip face surface positioned to abut together with the memory-chip face surface; and an interconnector forming an interface positioned between said DRAM and said logic chip for electrically connecting said memory chip together with said logic chip directly bonding said DRAM and said logic chip theretogether, the interface formed by said interconnector appearing to said DRAM to be of electrical characteristics substantially corresponding to an internal node of said DRAM.

11. An integrated circuit comprising:

a memory chip, said memory chip having a selected number of storage locations for storing data therein, said memory chip including a memory-chip face surface;

a logic chip having a logic-chip face surface positioned to abut together with the memory-chip face surface; and an interconnector exhibiting capacitance levels of less than ten picofarads forming an interface positioned between said memory chip and said logic chip for electrically connecting said memory chip together with said logic chip directly bonding said memory chip and said logic chip theretogether, the interface formed by said interconnector appearing to said memory chip to be of electrical characteristics substantially corresponding to an internal node of said memory chip.

* * * * *